United States Patent [19]

Alferness et al.

[11] Patent Number: 4,955,028

[45] Date of Patent: Sep. 4, 1990

[54] WAVELENGTH TUNABLE COMPOSITE CAVITY LASER

[75] Inventors: Rodney C. Alferness, Holmdel; Gadi Eisenstein, Middletown; Uziel Koren, Fair Haven; Ping K. Tien, Holmdel; Rodney S. Tucker, Howell; Matthew S. Whalen, Rumson, all of N.J.

[73] Assignee: AT&T Bell Laboratories, Murray Hill, N.J.

[21] Appl. No.: 173,488

[22] Filed: Mar. 25, 1988

[51] Int. Cl.$^5$ ............................................... H01S 3/10
[52] U.S. Cl. ....................................... 372/20; 372/92; 372/99; 372/102; 350/96.14; 350/96.13
[58] Field of Search ................. 372/20, 102, 99, 92; 350/96.14, 96.13, 359

[56] References Cited

U.S. PATENT DOCUMENTS 3,970,960 7/1976 Mollenauer ........................ 372/102

OTHER PUBLICATIONS

C. A. Park et al., "Single-Mode Behaviour of a Multimode 1.55 um Laser with a Fibre Grating External Cavity", 10/86, vol. 22, No. 21, pp. 1132-1134, Electronics Letters.
E. Brinkmeyer et al., "Fibre Bragg Reflector for Mode Selection and Line-Narrowing of Injection Lasers", 1/86, vol. 22, No. 3, pp. 134-135, Electronics Letters.
I. M. Jauncey et al., "Narrow-Linewidth Fibre Laser with Integral Fibre Grating", 9/86, vol. 22, No. 19, pp. 987-988, Electronics Letters.
L. Reekie et al., "Tunable Single-Mode Fiber Lasers", 7/86, vol. LT-4, No. 7, pp. 956-960, Journal of Lightwave Technology.
I. Bennion et al., "High-Reflectivity Monomode-Fibre Grating Filters", 3/86, vol. 22, No. 6, pp. 341-343, Electronics Letters.
M. S. Whalen et al., "Wavelength-Tunable Single-Mode Fibre Grating Reflector", 11/86, vol. 22, No. 24, pp. 1307-1308, Electronics Letters.
W. V. Sorin et al., "Tunable Single-Mode Output of a Multimode Laser in a Tunable Fibre Grating External Cavity", 4/87, vol. 23, No. 8, pp. 390-391, Electronics Letters.
M. S. Whalen et al., "Tunable Fibre-Extended-Cavity Laser", 3/87, vol. 23, No. 7, pp. 313-314, Electronics Letters.
Bulmer et al; "Single Mode Grating Coupling Between Thin-Film and Fiber Optical Waveguide", IEEE J. Q. E., vol. QE-14, No. 10, Oct. 78.

Primary Examiner—Léon Scott, Jr.
Attorney, Agent, or Firm—Gregory C. Ranieri

[57] ABSTRACT

Wavelength tunability and single frequency output are achieved in a coherent light source employing an adjustably controllable reflector. The light source includes a gain medium coupled to a single-mode fiber having a partially reduced cladding region at a predetermined distance from the gain medium. A Bragg reflector is either formed on the reduced cladding region of the single-mode fiber or formed on an external element in close proximity to the reduced cladding region. A single resonant optical cavity is formed by placing another reflector on the side of the gain medium opposite the gain medium-to-fiber coupling. Wavelength tuning of the light source is accomplished by controllably adjusting the period or the Bragg reflector element.

8 Claims, 4 Drawing Sheets

WAVELENGTH TUNABLE COMPOSITE CAVITY LASER

TECHNICAL FIELD

This invention relates to the field of optical sources and, more particularly, to composite cavity lasers.

BACKGROUND OF THE INVENTION

Coherent optical communication systems and wavelength-division-multiplexed networks require optical sources at a plurality of different wavelengths. It is also desired that such sources emit a single wavelength output.

Diffraction gratings have been used in optical sources and other optical devices for the separate purposes of linewidth narrowing and wavelength activity. For example, DBR and DRB lasers employ fixed diffraction gratings for linewidth narrowing a predetermined wavelength. However, such lasers are not dynamically tunable to other operating wavelength.

SUMMARY OF THE INVENTION

Dynamic tunability over a relatively broad wavelength runing range is achieved by a composite cavity laser including an optical fiber wavelength filter as an intra-cavity element within the same single resonant optical cavity as the optical gain medium. The optical fiber wavelength filter permits the wavelength of optical signals fed back to the gain medium to be varied continuously.

BRIEF DESCRIPTION OF THE DRAWING

A more complete understanding of the invention may be obtained by reading the following description of specific illustrative embodiments of the invention in conjunction with the appended drawings in which.

DETAILED DESCRIPTION

Figure 1:
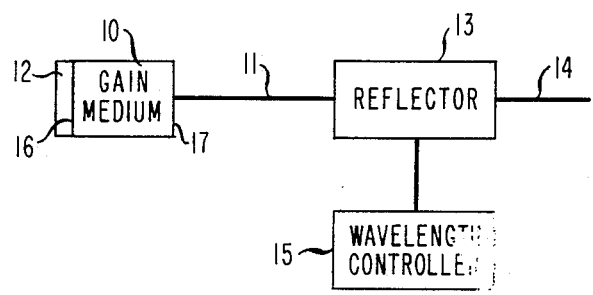
FIG. 1 shows a composite cavity laser in accordance with the principles of the present invention.

FIG. 1 shows a composite cavity laser in accordance with the broad principles of the invention. The composite cavity laser permits single mode operation (linewidth narrowing) while permitting dynamic wavelength control and tunability. Intra-cavity elements for the composite cavity laser are gain medium 10, single mode optical fiber 11 and reflector 13.

Single mode fiber 11 is optically coupled to gain medium 10 via an attached microlens or other suitable coupling element. The microlens is not shown but is well known to those of ordinary skill in the art and is fabricated by such techniques as arc fusion and the like. Antireflection coatings on surface 17 (R~1%) of the gain medium 10 and the facing end of optical fiber 11 reduce the possibility of unwanted internal reflections within the optical cavity while promoting efficient optical coupling. In addition, the antireflection coating on gain medium 10 prevents the gain medium 10 from being pumped to lase in an extra-cavity environment.

Single mode optical fiber 11 includes a section separated by some predetermined distance from the gain medium 10 in which a portion of the cladding layer is removed to permit evanescent coupling to the core of fiber 11. Lapping techniques for producing such "reduced cladding" fibers are well known to those skilled in the art.

Reflector 13 is positioned along the "reduced cladding" region of optical fiber 11. Positioning is accomplished either by forming the reflector on the "reduced cladding" region of optical fiber 11 or by placing the reflector on the "reduced cladding" region and applying index-matching fluid to fill in the voids therebetween. Optical signals propagating in the optical fiber interact via evanescent coupling with the reflector 13 to produce the desired effects in accordance with the principles of the invention. Backward coupled light from the reflector is the source of optical feedback for the composite cavity laser.

Reflector 13 may be a diffraction grating such as a Bragg reflector commonly used in semiconductor laser technology. The reflector has a period of $\Lambda$ and is coupled to the "reduced cladding" region of the optical fiber over a length L commonly called the interaction distance. The interaction distance is generally understodd to be the distance over which optical signals in the fiber interact with the reflector via the evanescent coupling mechanism.

Gain medium 10 includes an active gain medium such as a semiconductor heterostructure having mirror facets at surfaces 16 and 17 perpendicular to the propagation direction for optical signals generated therein. Another suitable gain medium is a length of doped optical fiber or molecular gas injected optical fiber. The gain medium also includes sufficient electrical or optical apparatus coupled to the active gain medium to cause a known condition necessary for stimulated emission of light therefrom. As stated above, one facet of the gain medium is coated with an antireflection coating such as a single layer of dielectric material such as lead silicate to reduce end reflections to approximately 1% and, therefore, eliminate the possibility of extra-cavity lasing for the gain medium. As the remote facet 16 of the gain medium is an optional reflection coating 12, if necessary, for providing a reflectivity of at least 30%. Together with reflector 13, remote facet 16 and/or reflection coating 12 define the single resonant optical cavity for the composite cavity laser.

Optical fiber 14 is coupled to the output end of fiber 11 to provide pigtail type coupling to the other fibers in a communication network or the like. In general, optical fiber 14 includes a beveled end face to eliminate end reflections from an air-to-glass interface.

Wavelength controller 15 is coupled to reflector 13 in order to provide dynamic tunability for the composite cavity laser. For each embodiment of the present invention, the embodiment of wavelength controller 15 is subject to change as described hereinbelow. As a general rule, the wavelength controller may include some mechanical or electromechanical element for changing the effective grating period Λ seen by optical signals evanescently coupled therewith. The mechanical or electromechanical element desirably provides functions such as translating reflector 13 or rotating reflector 13 or bending either the "reduced cladding" region of the fiber or the reflector 13. These functions will become apparent from the description of the remaining FIGS. below.

Figure 2:
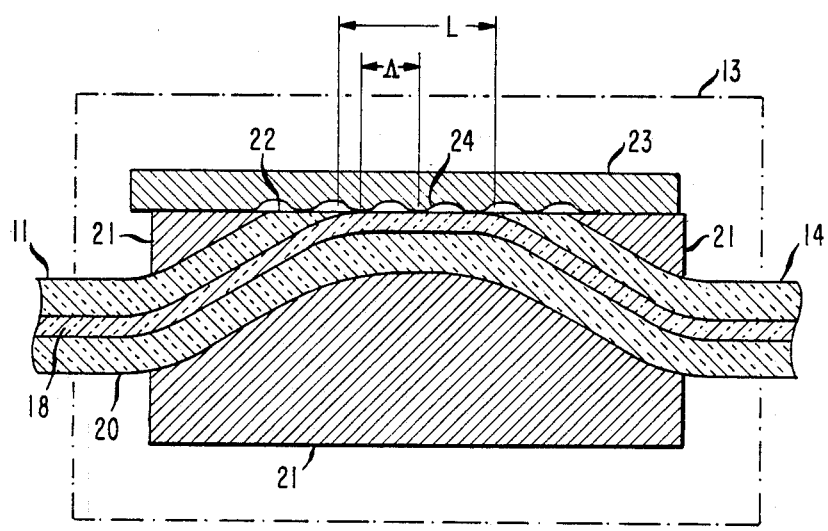
FIG. 2 shows a cross sectional view of the reflector element shown in FIG. 1.

An embodiment of the reflector 13 is shown in FIG. 2. As depicted in the drawing, optical fibers 11 and 14 are formed from one continuous fiber having core region 18 and cladding layer 20. The fiber is positioned over an arcuate-shaped block 21 to facilitate formation of a substantially flat surface 22 in the reduced cladding region of the fiber. Plate 23 comprising a suitable refractive index material such as a dielectric (glass) has a grating 24 inscribed thereon. Refractive index matching fluid is placed between the fiber and the grating to facilitate translation at the contacting surfaces and to increase the coupling strength between the evanescent field in the fiber and the grating. First or second order Bragg gratings may be employed provided that the proper grating period Λ is used, For first order Bragg gratings, the grating period Λ is defined as $\lambda = 2 n \Lambda$, where λ is the wavelength of the optical signals in the fiber and n is the effective refractive index seen by those optical signals in the interaction region. In one example from experimental practice, the grating period for a first order Bragg diffraction grating may be approximately 490 nm for an operating wavelength of 1.5 μm. Of course, the grating comprises spatially periodic perturbations continuously along the length of the fiber in the interaction region while being disposed substantially transverse to the core of the fiber.

Figure 3:
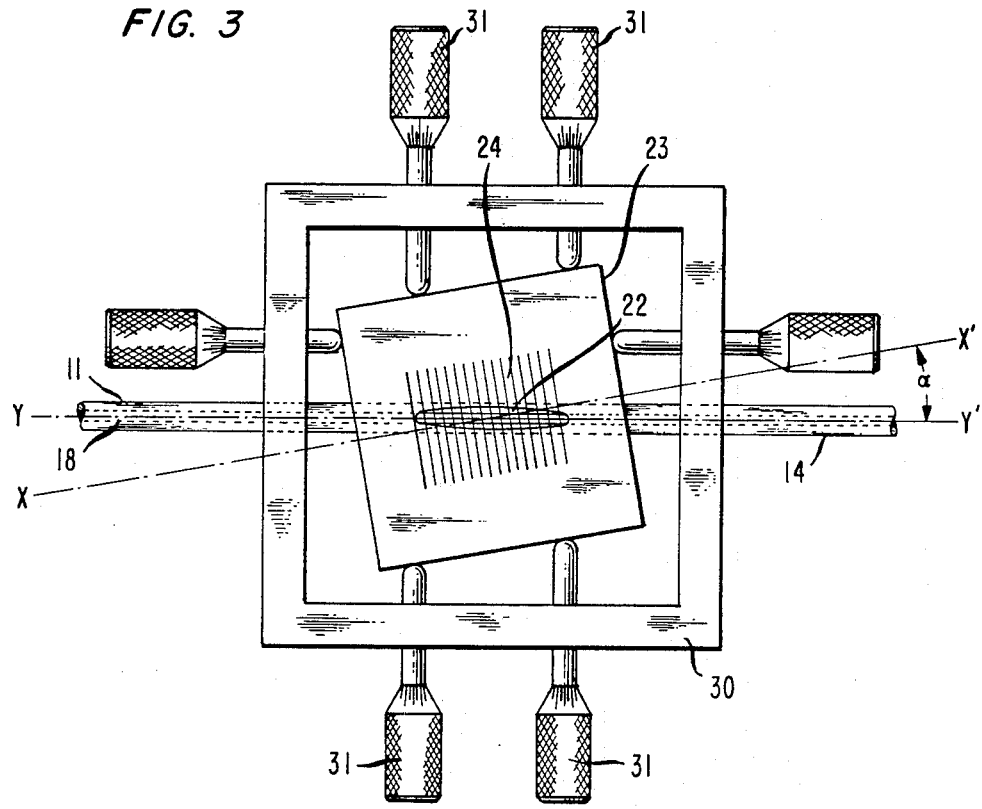
FIG. 3 shows one embodiment for manipulating a diffraction grating in the reflector element to achieve wavelength control and tuning.

In order to provide wavelength tuning for the reflector embodiment shown in FIG. 2, it is necessary to move the plate 23 as shown in FIG. 3 so that a major axis (X—X') of the grating which is substantially normal to each perturbation is rotated by some angle α from the major axis of the fiber (Y—Y'). A micrometer element having a plurality of adjustment set screws 31 mounted through a frame 30 is desirably suited for providing the necessary rotation described above. It should be understood that, as the grating is rotated in the manner described above, the period of the grating as seen by propagating optical signals is either increased or decreased. In this way, it is possible to tune the composite cavity laser to a predetermined wavelength.

The elliptical region shown in FIG. 3 is understood to depict the interaction region between the fiber and the grating.

Figure 4:
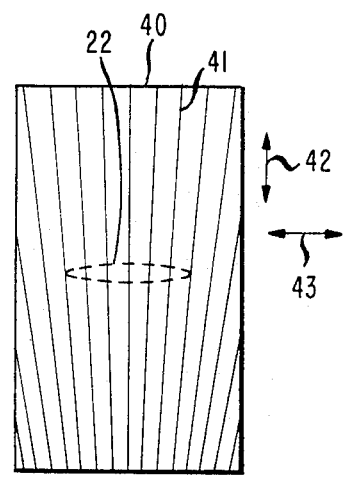
FIG. 4 shows a top view of a fan-type diffraction grating for use in the present invention.

An alternative embodiment for the plate and grating of FIGS. 2 and 3 is shown in FIG. 4. Plate 40 includes a fan grating 41 of the type shown and described an article in *ELECTRONICS LETTERS*, Vol. 22, No. 24, pp. 1307-8 (1986). The teachings of the cited article are expressly incorporated herein by reference.

In order to tune the composite cavity laser with the reflector shown in FIG. 4, it is necessary to use a mechanical or electromechanical element for translating the plate and grating over the underlying interaction region 22 is a transverse (direction 42) and/or longitudinal (direction 43) manner. Tuning is accomplished continuously because the grating period is monotonically increasing as viewed from the bottom of the FIG. 4 to the top. In an example from experimental practice, the grating period Λ varied from 497 to 537 nm to produce single mode, wavelength tunability over a range of 1.45 to 1.56 μm for the composite cavity laser.

Figure 5:
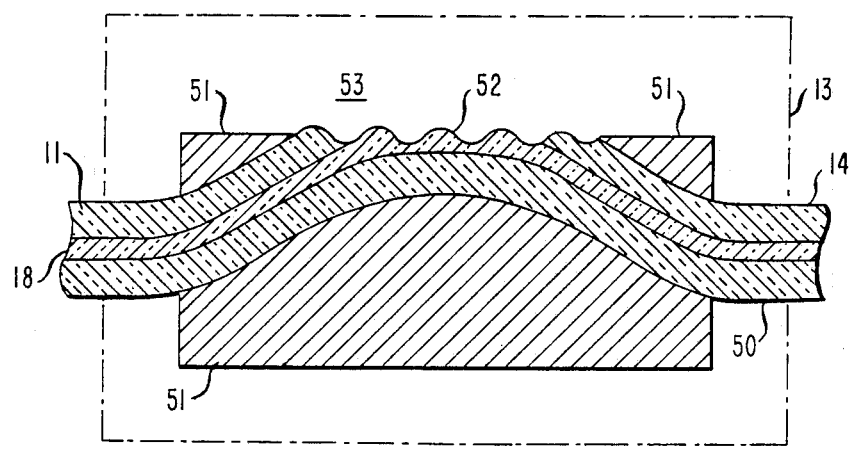
FIG. 5 shows an alternative embodiment of the reflector element in which the diffraction grating is formed directly on the optical fiber.

FIG. 5 depicts an alternative embodiment for the reflector shown in FIG. 2 wherein the grating is disposed directly on the optical fiber. Fiber 11 (and 14) is placed on an arcuate-shaped block of material 51 and grating 52 is formed directly on a substantially flat surface of the optical fiber.

Figure 6:
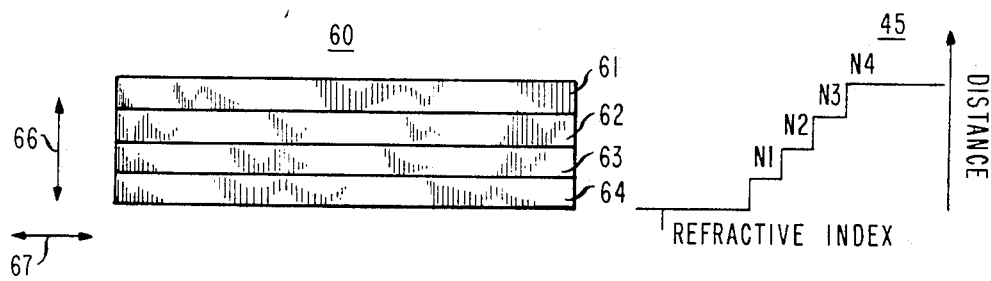
FIG. 6 shows a cross sectional view of a block of varying refractive index material employed in conjunction with wavelength control for the reflector shown in FIG. 5.

The reflector element shown in FIG. 5 may be used in conjunction with the device 60 shown in FIG. 6 which comprises layers of differing refractive index material. In the particular example shown in the FIG., the refractive index for each layer is less than the refractive index in the next layer. See the plot 45 of refractive index vs. distance included in FIG. 6. The device 60 may be realized from an optical fiber preform having the core-through-clad refractive index profile shown in plot 45.

Tuning is accomplished by translating the device 60 in transverse direction 66 and/or longitudinal direction 67 over grating 52. This causes the effective refractive index (propagation constant) seen by propagating optical signals to be varied accordingly. In general, a variety of dielectric materials are well known for achieving tunability around a predetermined operating wavelength.

Figure 7:
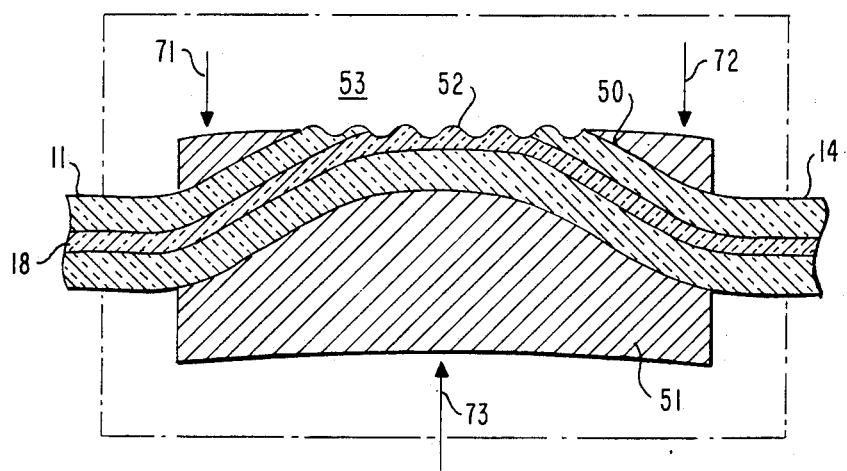
FIG. 7 shows in cross section an alternative approach for achieving wavelength control and tunability using the reflector shown in FIG. 5.

FIG. 7 depicts another way in which wavelength tunability may be effected for the reflector in FIG. 5. Simply shown, forces 71, 72 and 73 are applied to the reflector element 53 to cause the grating 52 to be distorted in a controllable manner. Accordingly, the grating period may be effectively increased or decreased.

What is claimed is:

1. A single wavelength optical source comprising a gain medium having first and second end surfaces opposite each other, said gain medium for generating optical signals over a substantially continuous range of wavelengths by spontaneous emission, a first reflector disposed on said first end surface of said gain medium, a single-mode optical fiber optically coupled to said gain medium through said second end surface, a second reflector comprising a portion of said single-mode optical fiber having a substantially flat, reduced cladding region over a predetermined length and a reflective filter means in close proximity with the reduced cladding region for evanescent optical coupling thereto, said first and second reflectors forming a single resonant optical cavity therebetween with said optical fiber and said gain medium disposed within said cavity, and means connected to said second reflector for dynamically controlling the reflective filter means to reflect toward said first reflector optical signals substantially at said single wavelength so that said source is tunable to any single wavelength in the continuous range of wavelengths spontaneously emitted by said gain medium.

2. The optical source defined in claim 1 wherein said reflective filter means includes a diffraction grating element having spatially periodic perturbations continuously along the length thereof and substantially transverse to a major axis thereof, and said means for dynamically controlling includes means for rotating said diffraction grating element so that the major axis of the diffraction grating element is displaced from the longitudinal axis of the single-mode optical fiber by an angle α.

3. The optical source defined in claim 1 wherein said reflective filter means includes a diffraction grating element having spatially periodic perturbations continuously along the length thereof and substantially transverse to a major axis thereof, and said means for dynamically controlling includes means for rotating said single-mode optical fiber so that the major axis of the diffraction grating element is displaced from the longitudinal axis of the single-mode optical fiber by an angle α.

4. The optical source as defined in claim 1 wherein said reflective filter means includes a diffraction grating element having spatially periodic perturbations continuously along the length thereof and substantially transverse to a mojor axis thereof, the period of said perturbations increasing as the diffraction grating element is traversed in a transverse direction to said major axis, and means for dynamically controlling includes means for translating said diffraction grating element with respect to said single-mode optical fiber in a direction transverse to longitudinal axis of the single-mode optical fiber, said longitudinal axis of the single-mode optical fiber and said major axis of the diffraction grating element being substantially coplanar.

5. The optical source as defined in claim 1 wherein said reflective filter means includes a diffraction grating element having spatially periodic perturbations continuously along the length thereof and substantially transverse to a major axis thereof, the period of said perturbations increasing as the diffraction grating element is traversed in a transverse direction to said major axis, and said means for dynamically controlling includes means for translating said single-mode optical fiber with respect to said diffraction grating means in a direction transverse to longitudinal axis of the single-mode optical fiber, said longitudinal axis of the single-mode optical fiber and said major axis of the diffraction grating element being substantially coplanar.

6. The optical source defined in claim 1 wherein said reflective filter means includes a diffraction grating disposed on the reduced cladding region of the single-mode optical fiber, said diffraction grating having spatial periodic perturbations along the longitudinal axis of the single-mode optical fiber and substantially transverse to the direction of optical propagation in said single-mode optical fiber, and said means for actively controlling includes means for bending said diffraction grating to vary the length of the perturbation period.

7. The optical source defined in claim 1 wherein said reflective filter means includes a diffraction grating disposed on the reduced cladding region of the single-mode optical fiber, said diffraction grating having spatial periodic perturbations along the longitudinal axis of the single-mode optical fiber and substantially transverse to the direction of optical propagation in said single-mode optical fiber, and said means for dynamically controlling includes means for varying the effective propagation constant within said second reflector.

8. The optical source defined in claim 7 wherein said reflective filter means includes a diffraction grating disposed on the reduced cladding region of the single-mode optical fiber, said diffraction grating having spatial periodic perturbations along the longitudinal axis of the single-mode optical fiber and substantially transverse to the direction of optical propagation in said single-mode optical fiber, and said means for varying the effective propagation constant includes an element having a plurality of layers, each layer having a refractive index being substantially similar within the same layer and being substantially different from the remaining plurality of layers, said element being disposed so that substantially only one layer of the plurality of layers is in close proximity to said diffraction grating, and means for translating said element across the grating to change, from one to another, the layer in close proximity to the diffraction grating.

* * * * *